United States Patent [19]
Paul

[11] Patent Number: 6,034,868
[45] Date of Patent: Mar. 7, 2000

[54] EXPANSION CHASSIS HAVING A REMOVABLE WIRING BRACKET AND EXTERNAL COMPUTER MEMORY

[75] Inventor: Dieter G. Paul, Anaheim, Calif.

[73] Assignee: Kingston Technology Company, Fountain Valley, Calif.

[21] Appl. No.: 08/931,110

[22] Filed: Sep. 15, 1997

[51] Int. Cl.[7] ............................ G06F 1/16; H01R 13/629; H05K 5/20
[52] U.S. Cl. .......................... 361/684; 361/685; 439/377; 439/928.1
[58] Field of Search .................................... 361/684, 685, 361/686; 364/708.1; 439/377, 928.1

[56] References Cited

U.S. PATENT DOCUMENTS

| | | | |
|---|---|---|---|
| 3,925,710 | 12/1975 | Ebert ......................................... | 361/685 |
| 5,299,944 | 4/1994 | Larabell et al. .......................... | 439/377 |
| 5,340,340 | 8/1994 | Hastings et al. ...................... | 439/928.1 |
| 5,604,662 | 2/1997 | Anderson et al. ...................... | 361/685 |
| 5,652,695 | 7/1997 | Schmitt ..................................... | 361/685 |
| 5,684,671 | 11/1997 | Hobbs et al. ............................. | 361/685 |
| 5,734,549 | 3/1998 | Oura ......................................... | 361/685 |
| 5,777,264 | 7/1998 | Chen ......................................... | 361/685 |

*Primary Examiner*—Leo P. Picard
*Assistant Examiner*—Lisa Lea-Edmonds
*Attorney, Agent, or Firm*—Morland C. Fischer

[57] ABSTRACT

An expansion chassis which enables a personal computer to have increased memory capacity. The chassis encloses a removable wiring bracket that carries an external computer memory (e.g. a conventional disk drive, tape drive and the like). When the wiring bracket is removably received through a window at the front of the expansion chassis, a first electrical connector mounted on the wiring bracket is detachably mated to a second electrical connector mounted on the front of the expansion chassis adjacent the window thereof so as to complete an electrical circuit between the external computer memory and the expansion chassis. A position variable switch is also mounted on the expansion chassis adjacent the window so as to quickly and conveniently assign a particular predetermined address to the external computer memory corresponding to the position to which the variable position switch has been set.

15 Claims, 4 Drawing Sheets

EXPANSION CHASSIS HAVING A REMOVABLE WIRING BRACKET AND EXTERNAL COMPUTER MEMORY

BACKGROUND OF THE INVENTION

1. Field of the Invention

This invention relates to an expansion chassis which enables a personal computer to have increased memory capacity. The chassis encloses a removable wiring bracket that carries an external computer memory (e.g. a conventional disk drive, tape drive, and the like) to which a particular predetermined address can be assigned.

2. Background Art

In some cases, the size of the memory of a personal computer is insufficient to complete complex and/or many applications. Accordingly, it has been known to increase the memory capacity of a personal computer by means of one or more expansion chassis which house external computer memories that can be devoted to individual applications. So that the computer network can be efficiently operated, it is necessary to assign an address or identification to each external memory to enable the personal computer to be able to selectively access respective ones of the memories depending upon the task to be performed.

It is common to set the identification of the external memory at the rear or bottom of its expansion chassis. This location results in a large number of electrical wires running through the interior of the chassis for connection to a corresponding number of I/O cables. Consequently, the process of identifying and distinguishing the external memories and networking the memories with a personal computer has proven to be undesirably complex, time consuming and cumbersome resulting in the consumption of a relatively large amount of space.

It is common for the expansion chassis to be manufactured with the external computer memory fixedly installed therewithin. As a consequence of the foregoing, it is not practical to remove the memory for security reasons or for relocation from one expansion chassis to another. Since the computer memory is not easily removable, the entire chassis may need to be taken out of service or even scrapped should the memory be in need of repair.

Therefore, what is needed is the ability to assign an address or identification to an external computer memory at a convenient and operator accessible location on the expansion chassis so as to facilitate the interconnection of the external memory to a personal computer and minimize the space that is consumed by the electrical wiring as a result thereof. What is also needed are quick and easy ways to install the external memory in its expansion chassis while allowing for the removal of the computer memory from its chassis to permit repair and/or replacement of the memory without having to alter the chassis.

SUMMARY OF THE INVENTION

An external expansion chassis for a personal computer is disclosed which enables the computer to have an increased memory capacity. The expansion chassis houses a removable wiring bracket that carries an external computer memory such as a conventional disk drive, tape drive, and the like. Located at the front of the expansion chassis is an open window through which the removable wiring bracket is inserted for installation. The wiring bracket is moved inwardly of the open window to be seated upon and slide along a pair of opposing lips that project towards one another from respective parallel aligned side plates at the interior of the expansion chassis.

The removable wiring bracket has a pair of blocking flanges disposed at the front-most end to engage the front of the expansion chassis and thereby limit the movement of the wiring bracket into the expansion chassis through the open window thereof. A first printed circuit board is secured to the rear of one of the blocking flanges of the wiring bracket. A pair of colored light emitting diodes (LEDs) extends from the first printed circuit board through respective holes in the blocking flange so as to be visible from the front of the expansion chassis when the wiring bracket is installed. The LEDs are selectively illuminated to indicate either normal or fault drive activity. A bundle of electrical wires runs from the first printed circuit board to the rear of the external computer memory via a wire channel that extends along a side of the wiring bracket. A first electrical connector that is coupled to the bundle of electrical wires is also located on the first printed circuit board of the wiring bracket.

A second printed circuit board is affixed to the front of the expansion chassis. Located on the second printed circuit board is a second electrical connector, another LED to indicate a powered-up condition, and a multi-position address selection switch that can be variably set to correspond to a particular predetermined address. When the wiring bracket is installed inwardly of the window in the expansion chassis, the first and second electrical connectors on the first and second printed circuit boards will be arranged in opposing face-to-face alignment with one another so as to be pushed into detachable mating engagement and thereby complete an electrical circuit from the address selection switch to the external computer memory by way of the wire bundle. Accordingly, the external computer memory can be made to take on the address or identification of the address selection switch at a convenient and operator accessible location at the front of the expansion chassis. Moreover, the wiring bracket may be pulled out of the expansion chassis to cause the first and second electrical connectors to be detached from the one another, whereby the external computer memory is removed for repair, replacement, storage at a secure facility or relocation to another expansion chassis.

DESCRIPTION OF THE PREFERRED EMBODIMENT

Figure 1:
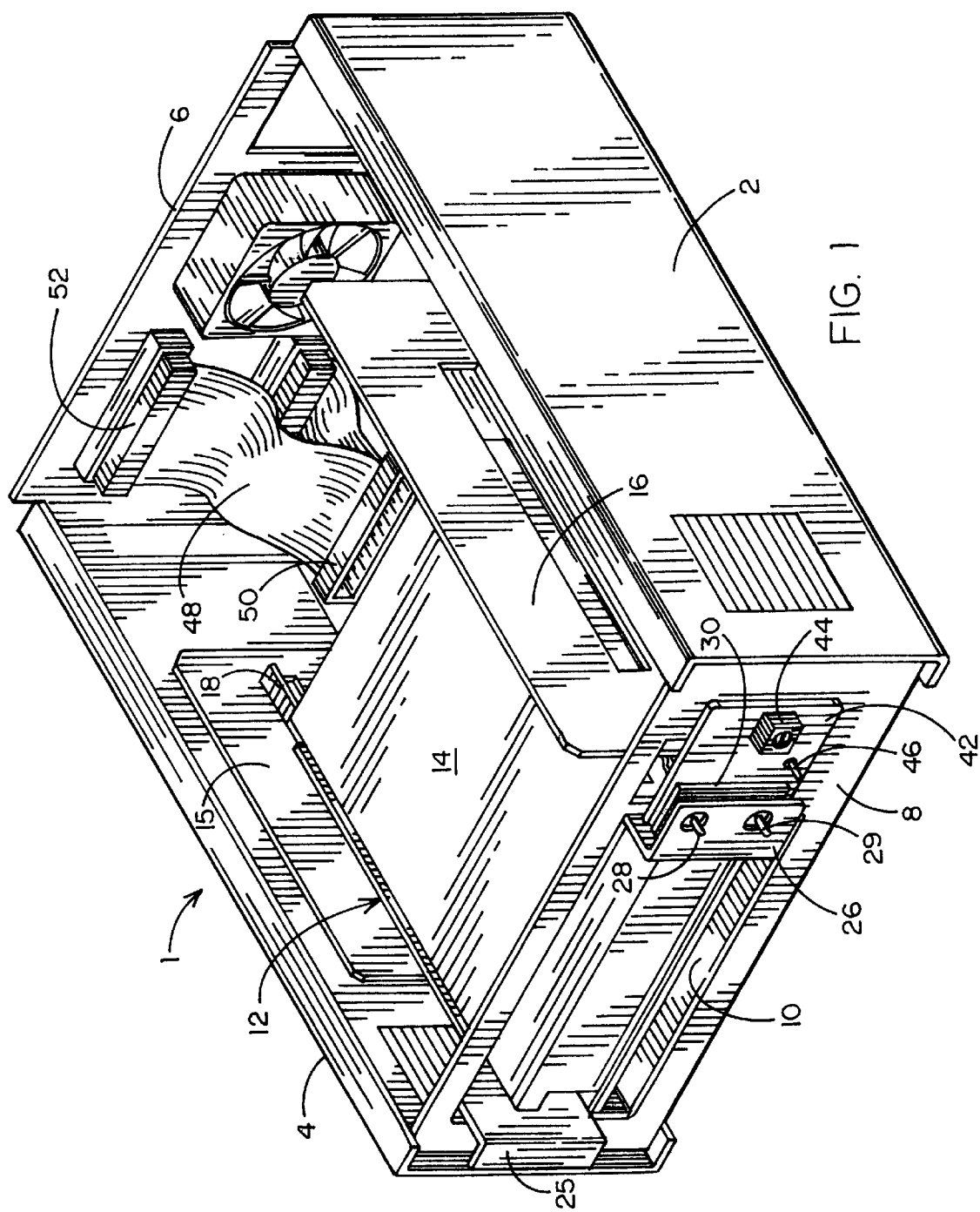
FIG. 1 is a perspective view showing the removable wiring bracket and external computer memory installed in an expansion chassis.
Figure 2:
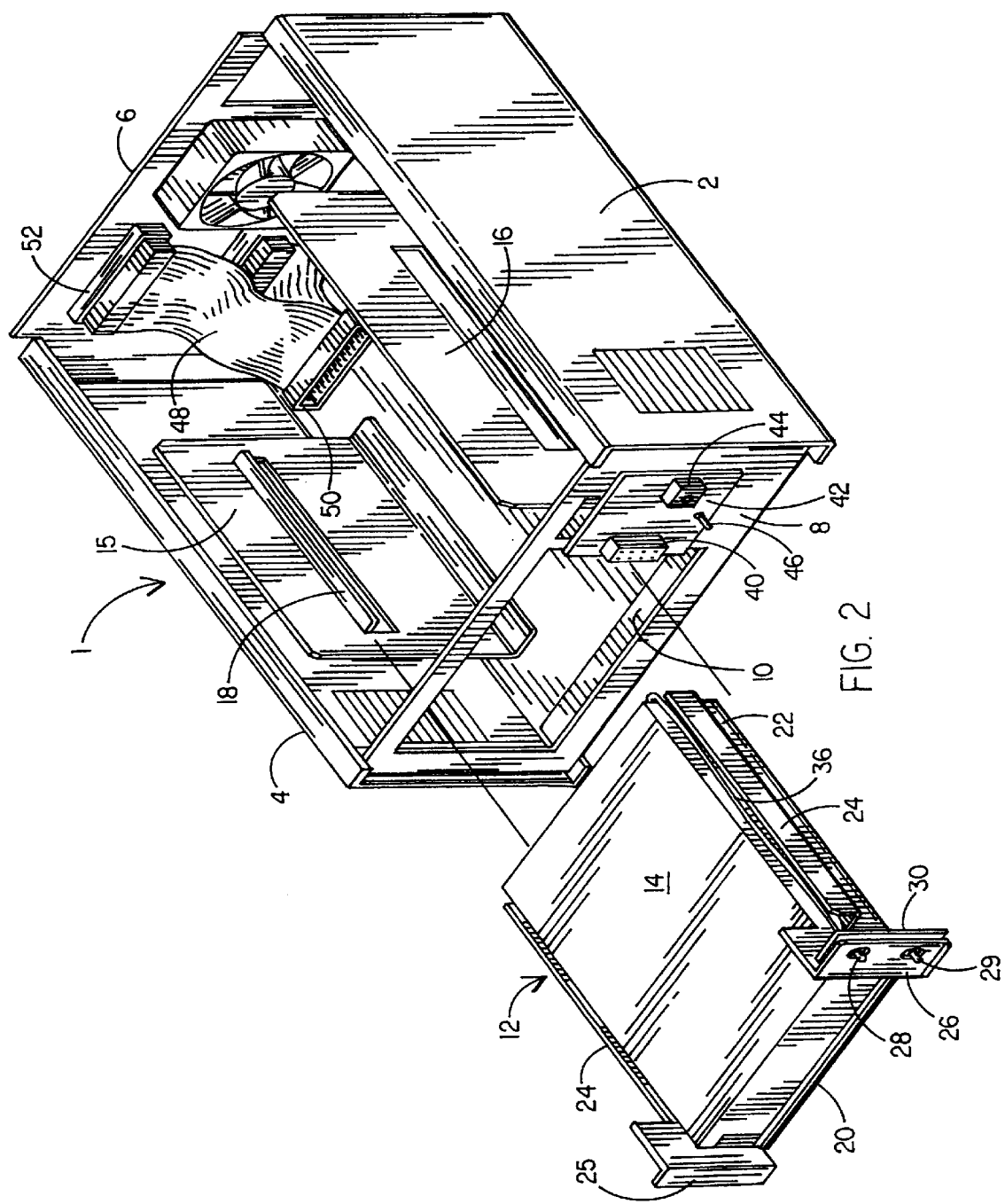
FIG. 2 is an exploded view showing the removable wiring bracket and external computer memory being installed in or removed from the expansion chassis of FIG. 1.

The external expansion chassis 1 which forms the present invention is now described while referring initially to FIGS. 1 and 2 of the drawings. The expansion chassis 1 is preferably manufactured from metal and includes a pair of opposing side walls 2 and 4 and a back plane 6. The front 8 of the expansion chassis 1 has an open window 10 formed therein which is of suitable size to accommodate therethrough an external computer memory 14 that is affixed (e.g. screwed) to and carried by a removable wiring bracket 12. The external computer memory 14 is conventional and may be a commercially available tape drive, disk drive, or the like. By way of example only, external computer memory 14 may be drive Model No. ST31200WD manufactured by Seagate Corporation. As is best shown in FIG. 2, the external computer memory 14 is seated upon and transported with the removable wiring bracket 12, the details of which will be explained in greater detail hereinafter.

As is also best shown in FIG. 2, a pair of opposing side plates 15 and 16 project vertically in spaced, parallel alignment from the bottom of the expansion chassis 1. The side plates 15 and 16 are spaced inwardly from the respective chassis side walls 2 and 4. Each side plate 15 and 16 has a flat, elongated lip (only one of which 18 is visible in FIGS. 1 and 2) extending horizontally and projecting inwardly towards the interior of expansion chassis 1. In the installed configuration of FIG. 2, the wiring bracket 12 is disposed inwardly of the window 10 at the front 8 of the expansion chassis 1 so as to be located between the opposing vertical side plates 15 and 16 and slide along the horizontal lips 18 thereof. A power supply (not shown) for the computer memory 14 lies between the side plate 16 and the side wall 2 of chassis 1.

Referring now to FIGS. 1–4 of the drawings, the wiring bracket 12 is also manufactured from metal and has a flat base 20 upon which the external computer memory 14 is seated and secured. Bending upwardly from the flat base 20 of wiring bracket 12 are a pair of opposing side walls 22. Each side wall 22 of wiring bracket 12 has an outwardly and upwardly turned wire channel 24 running longitudinally therealong. The wire channels 24 of wiring bracket 12 are supported upon and slidable along the horizontal lips 18 of side plates 15 and 16 when the wiring basket 12 is installed in expansion chassis 1 through window 10.

Located at the front of the side walls 22 of wiring bracket 12 ahead of the external computer memory 14 are outwardly turned blocking flanges 25 and 26. The blocking flanges 25 and 26 at the front of wiring bracket 12 perform two functions which are important to the present invention. First, the blocking flanges 25 and 26 limit the inward movement of wiring bracket 12 through the window 10 at the front 8 of expansion chassis 1. That is, and as is best shown in the installed configuration of FIG. 1, as the wiring basket 12 moves through window 10 so as to be received between vertical side plates 15 and 16 and slide along the horizontal lips 18 thereof, the blocking flanges 25 and 26 will be correspondingly moved towards and into contact with the front 8 of the expansion chassis 1 to thereby block any further inward movement of wiring bracket 12 towards the interior of the chassis.

Figure 3:
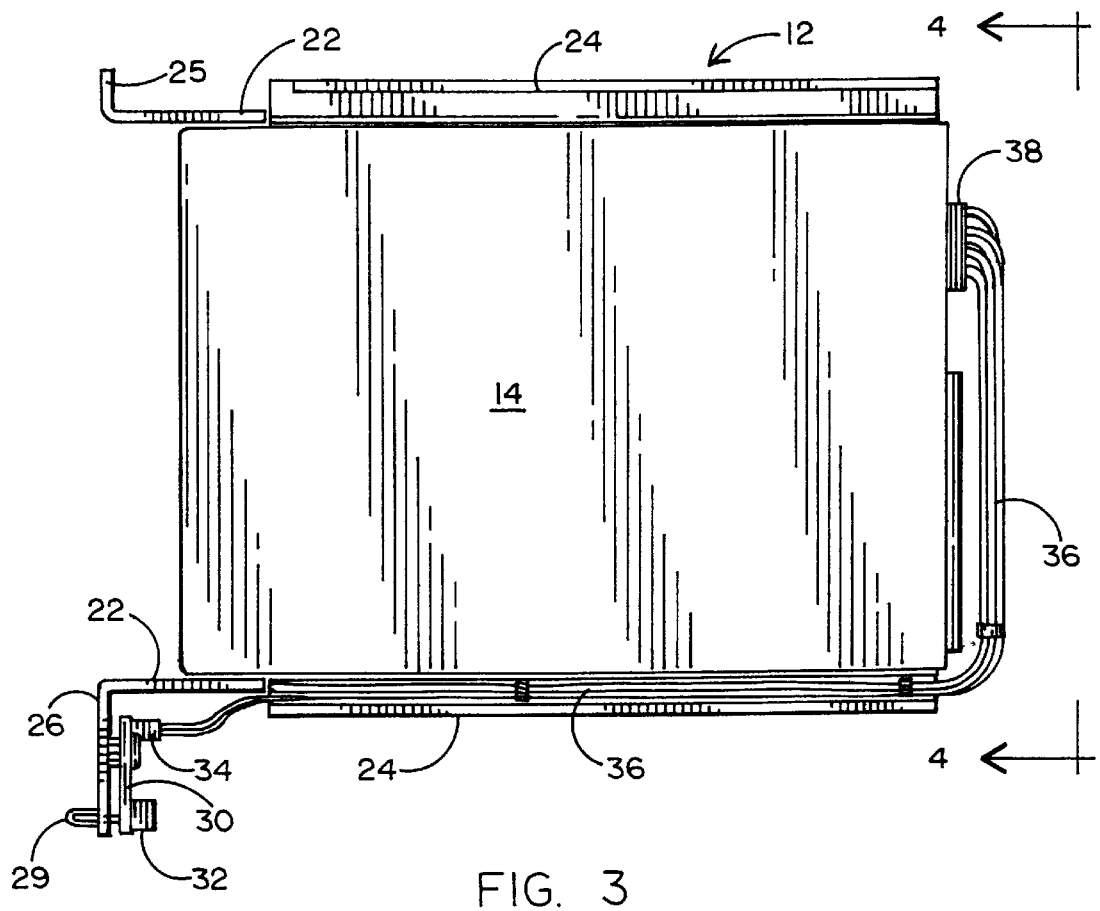
FIG. 3 is a top plan view of the removable wiring bracket and external computer memory.
Figure 4:
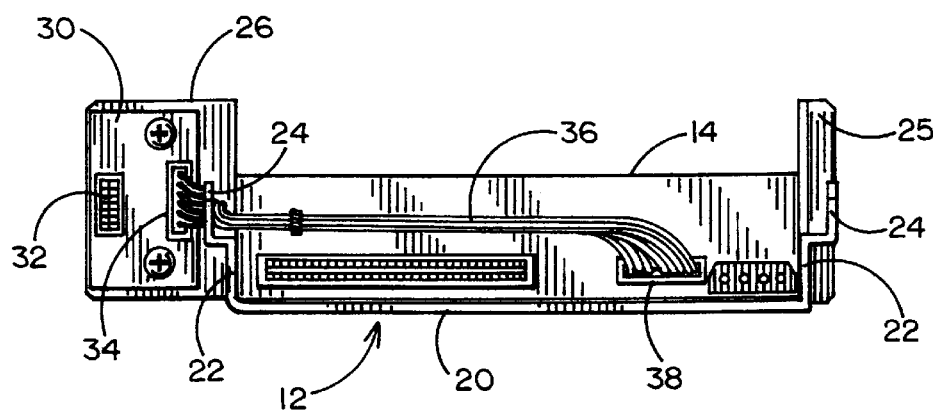
FIG. 4 is a rear elevational view of the removable wiring bracket and external computer memory.

As a second important function, one of the blocking flanges (e.g. 26) is of sufficiently large size to be able to accommodate a pair of light emitting diodes (LEDs) 28 and 29 through respective holes that are formed therethrough so that LEDs 28 and 29 will be visible at the front of the external expansion chassis 1. The LEDs 28 and 29 preferably have different colors (e.g. green and yellow) to indicate different status conditions for external computer memory 14. By way of example, one of the LEDs 28 will be illuminated to indicate normal drive activity, while the other LED 29 will be illuminated to indicate a drive fault. As is best shown in FIGS. 3 and 4, the LEDs 28 and 29 are mounted upon one side of a printed circuit board 30 that is affixed (e.g. screwed) to the rear of blocking flange 26.

Printed circuit board 30 also carries a pair of series connected electrical connectors 32 and 34 at the opposite side thereof that enable the particular external computer memory 14 carried by wiring bracket 12 to be selectively addressed when the wiring bracket is installed within the external computer chassis 1 in the manner shown at FIG. 1. In this regard, and as is best illustrated in FIGS. 3 and 4, a bundle of electrical wires 36 runs from a first of the pair of electrical connectors 34 on the printed circuit board 30 at the rear of blocking flange 26, along and through the longitudinally extending wire channel 24 at one side wall 22 of wiring bracket 12, for termination at another electrical connector 38 which is shown attached at the rear of the external computer memory 14. The individual wires that form wire bundle 36 carry signals to and from the external computer memory 14 corresponding to drive status, drive identification, SCSI operation, and the like.

The second of the pair of electrical connectors 32 on the printed circuit board 30 at the rear of blocking flange 26 is adapted to be pushed into detachable mating engagement with a complementary electrical connector 40 (of FIG. 2) that is located at the front 8 of expansion chassis 1. More particularly, a printed circuit board 42 is affixed (e.g. screwed) to the front 8 of the expansion chassis 1 adjacent one side of the window 10. The aforementioned electrical connector 40 is mounted on the printed circuit board 42 so that the complementary electrical connectors 32 and 40 on the respective printed circuit boards 30 and 42 will be arranged in opposing face-to-face alignment when the wiring bracket 12 and the external computer memory 14 carried thereby are moved through window 10 into the interior of chassis 1. Thus, when the blocking flange 26 at the front of wiring bracket 12 is pushed into contact with the front of the expansion chassis 1, the electrical connectors 32 and 40 will be correspondingly mated together to complete an electrical circuit to the computer memory 14 via the electrical wire bundle 36, the series connected electrical connectors 32 and 34 on circuit board 30, and the multi-pin electrical connector 40 on circuit board 42.

Also mounted on the printed circuit board 42 at the front 8 of external expansion chassis 1 is an address selection switch 44 and another LED 46. Address selection switch 44 is adapted to be set to represent a particular predetermined identification or address that is assigned to the external computer memory 14 of wiring bracket 12 so as to distinguish the memory 14 from other external memory locations (not shown). By way of example, address selection switch 44 is a conventional 16-position switch available from Omron Corporation. The address selection switch 44 at the front of expansion chassis 1 is interconnected with computer memory 14 at the interior of chassis 1 via the wire bundle 36 when the wiring bracket 12 is moved through window 8 for installation, whereby the opposing complementary connectors 32 and 40 are mated to one another as was earlier explained. In the case where electrical power is applied to expansion chassis 1, the LED 46 on printed circuit board 42 will be illuminated to indicate a powered up condition.

With wiring bracket 12 properly installed at the interior of external expansion chassis 1 as shown in FIG. 1, the external computer memory 14 can be coupled to a conventional ribbon cable 48 that runs between input and output connectors 50 and 52. Input connector 50 is shown in FIG. 1 ready to be coupled to a complementary connector at the rear of computer memory 14, while output connector 52 is coupled to a complementary connector at the back plane 6 of expansion chassis 1 where one or more input/output terminals (not show) are available to permit communication between memory 14 and a personal computer (also not shown). Ribbon cable 48 functions as a data cable by which the contents of external computer memory 14 may be accessed when memory 14 is selectively addressed by the computer.

By virtue of the present invention, one or more external expansion chassis 1 can be located near and/or at a remote location relative to a personal computer to receive respective removable and interchangeable wiring brackets 12. This it becomes a simple matter to construct the expansion chassis 1 by merely taking a pre-assembled wiring bracket 12 and external computer memory 14 and installing (i.e. pushing) the wiring bracket through the open window 10 at the front 8 of chassis 1 as previously disclosed. In this same regard, the computer memory 14 may be repaired, replaced, stored at a secure facility or relocated to a different expansion chassis without altering its own expansion chassis by exerting a sufficient pulling force on the blocking flanges 25 and 26 to remove the wiring bracket 12 and thereby detach the electrical connectors 32 and 40 from one another so as to break the electrical circuit established thereby.

Moreover, a conventional computer memory (i.e. drive 14) can be made to take on a predetermined address as established by address selection switch 44. It may be appreciated that the aforementioned address selection switch 44, as well as the LEDs 28, 29 and 46 for providing visual indications of power and drive activity, and the connectors 32, 34 and 40 which permit the wire bundle 36 of computer memory 14 to be interfaced with the address selection switch 44 are all conveniently located and operator accessible at the front 8 of the expansion chassis 1. The foregoing facilitates a particular predetermined address being quickly and easily assigned to external computer memory 14 while eliminating the multitude of wires and I/O cables that have heretofore been associated with conventional external expansion chassis.

Figure 5:
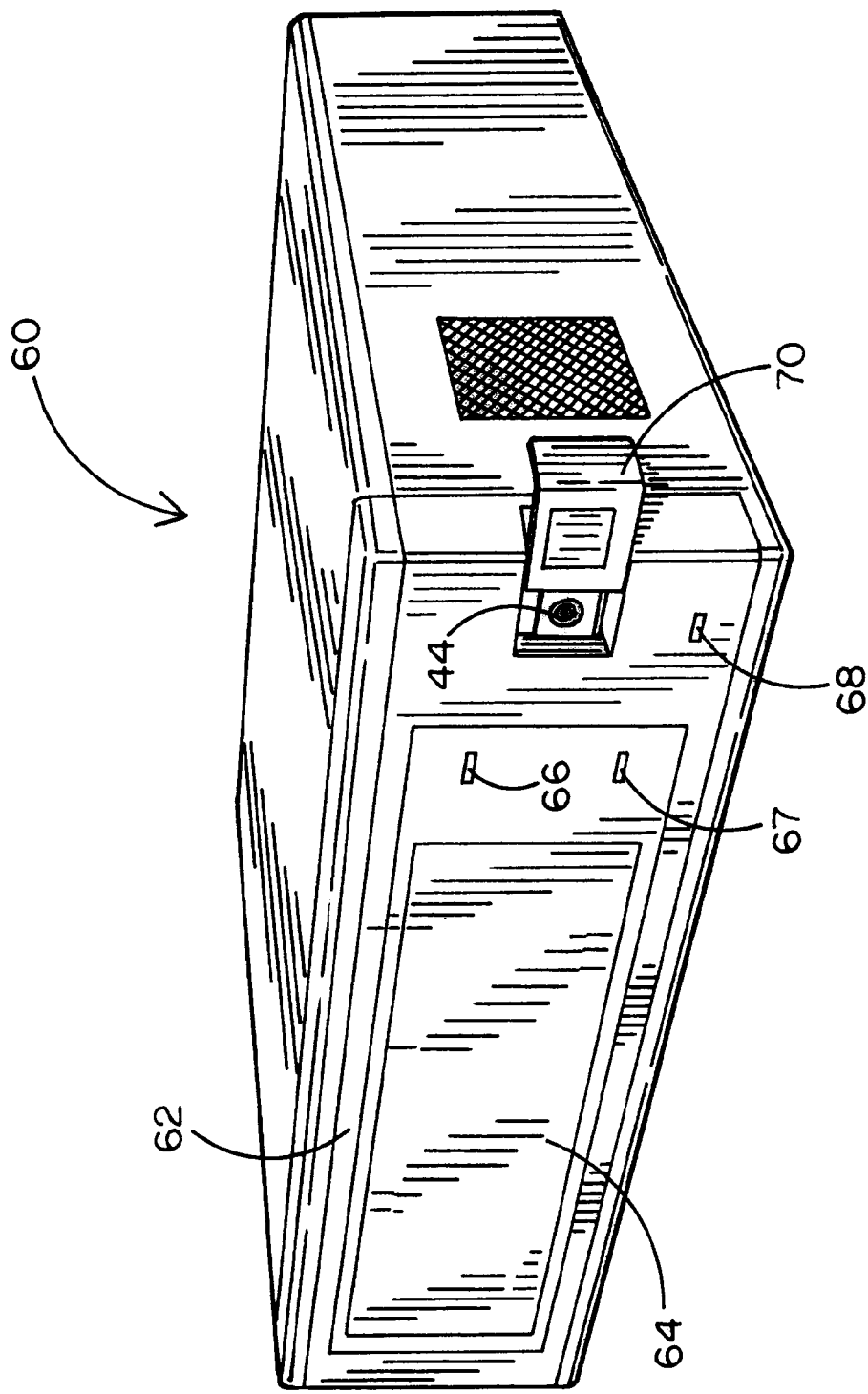
FIG. 5 shows a housing for surrounding the expansion chassis of FIG. 1.

FIG. 5 of the drawings shows a housing 60 for surrounding and protecting the expansion chassis 1 of FIGS. 1–4. Although a single housing 60 is shown to surround a single expansion chassis 1 and the removable wiring bracket 12 therewithin, a plurality of similar housings may be stacked one above the other when it is desirable for a computer to have access to multiple external memories such as that designated 14. The housings 60 may be stacked on a table or located in a rack or drive bay.

The housing 60 includes a front face 62 having a normally closed doorway 64 that overlays the open window 10 of expansion chassis 1. Located on the front face 62 adjacent the doorway 64 are a pair of transparent lenses 66 and 67 which are positioned to cover the LEDs 28 and 29 shown in FIGS. 1 and 2. Another transparent lens 68 covers the LED 46. As may be appreciated, the lenses 66–68 enable the user to see when the LEDs 28, 29, and 46 are illuminated to indicate power and the status of external computer memory 14.

Located at one side of the front face 62 of housing 60 is a sliding door 70 that is adapted to slide between open and closed positions. In the closed position, the sliding door 70 covers the multi-position address selection switch 44 on the front of expansion chassis 1 so as to prevent access to and an inadvertent operation of the switch 44. When the door 70 is moved to the open position, the address selection switch 44 will be exposed and made readily available to the user to enable the address of the external computer memory 14 to be selectively manipulated as has been described above.

It will be apparent that while a preferred embodiment of the invention has been shown and described, various modifications and changes may be made without departing from the true spirit and scope of the invention. Having set forth the preferred embodiment, what is claimed is:

I claim:

1. In combination:

an expansion chassis to be electrically connected to a computer to increase the memory capacity of the computer, said expansion chassis having a front wall, a rear wall, a window formed through said front wall, and a first electrical connector mounted on said front wall adjacent said window; and a wiring bracket on which an external computer memory is carried, said wiring bracket being removably received through said window in said expansion chassis for receipt therewithin so that said computer memory is coupled to said expansion chassis, said expansion chassis having support means by which to slidably receive said wiring bracket and support said external computer memory when said wiring bracket is moved through said window, and said wiring bracket including at least one blocking flange positioned so as to engage the front wall of said expansion chassis when said wiring bracket is removably received through said window to limit the movement of said wiring bracket inwardly of said expansion chassis and a second electrical connector carried by said blocking flange, said first and second electrical connectors being detachably mated together to complete an electrical circuit between the external computer memory of said wiring bracket and said expansion chassis when said wiring bracket is removably received through said window.

2. The combination recited in claim 1, wherein the support means of said expansion chassis includes a pair of opposing walls having respective outwardly projecting lips, said wiring bracket being slidable along and supported by said lips when said wiring bracket is removably received through said window in said expansion chassis.

3. The combination recited in claim 1, said wiring bracket also having a wire channel extending therealong, and a bundle of electrical wires running through said wire channel between said second electrical connector at said blocking flange and said external computer memory.

4. The combination recited in claim 3, said wiring bracket also having at least one light emitting diode located at said blocking flange and electrically connected to said external computer memory by way of said second electrical connector and said bundle of electrical wires, said light emitting diode providing an indication of the operating condition of said external computer memory.

5. The combination recited in claim 1, said expansion chassis also having identification means located adjacent said window thereof by which to assign an address to said external computer memory when said wiring bracket is removably received through said window and said first and second electrical connectors are mated together.

6. The combination recited in claim 5, wherein said identification means of said expansion chassis for assigning an address to said external computer memory is a position variable switch.

7. The combination recited in claim 6, wherein said expansion chassis has a front, a back and opposite sides, said window being formed at the front of said expansion chassis, and said first electrical connector and said position variable switch being electrically connected to one another and mounted on the front of said expansion chassis adjacent said window.

8. The combination recited in claim 7, wherein said expansion chassis also has a ribbon cable to transmit data between said computer and said external computer memory, said ribbon cable extending from an I/O terminal at the back of said expansion chassis to said external computer memory when said wiring bracket is removably received through said window at the front of said expansion chassis.

9. An expansion chassis to be electrically connected to a computer to increase the memory capacity of the computer, said expansion chassis comprising:

a housing having a front wall, a rear wall, and a particular address;

a wiring bracket;

an external computer memory carried by said wiring bracket;

a window in the front wall of said housing for removably receiving said wiring bracket to locate said external computer memory inside of said housing and between the front and rear walls thereof; and identification means by which to assign the particular address of said housing to said external computer memory when said wiring bracket is removably received through said window and said external computer memory is located inside of said housing, said identification means being attached to the front wall of said housing adjacent said window.

10. The expansion chassis recited in claim 9, wherein said identification means is a position variable switch.

11. The expansion chassis recited in claim 9, further comprising a first electrical connector mounted on said wiring bracket and a second electrical connector mounted on said housing, said first and second electrical connectors being detachably mated together to complete an electrical circuit between said external computer memory and said identification means when said wiring bracket is removably received through said window to locate said external computer memory inside of said housing.

12. The expansion chassis recited in claim 11, further comprising a bundle of electrical wires running from said first electrical connector to said external computer memory, and a wire channel extending along said wiring bracket in which to receive and carry said bundle of electrical wires.

13. The expansion chassis recited in claim 11, said wiring bracket having a blocking flange to engage the front wall of said housing of said expansion chassis when said wiring bracket is removably received through said window to thereby limit the movement of said wiring bracket inwardly of said housing, said first electrical connector being mounted on said blocking flange.

14. The expansion chassis recited in claim 13, wherein said second electrical connector is located on the front wall of said housing of said expansion chassis adjacent said window.

15. The expansion chassis recited in claim 9, said housing also having a movable door that is positioned over said identification means, said movable door moving from a closed position at which to block manual access to said identification means to an open position at which to permit manual access to said identification means.

* * * * *